(12) United States Patent  (10) Patent No.: US 7,095,048 B2
Kawamura  (45) Date of Patent: Aug. 22, 2006

(54) SEMICONDUCTOR DEVICE, ELECTRONIC CIRCUIT ARRAY SUBSTRATE PROVIDED WITH THE SAME AND METHOD OF MANUFACTURING THE ELECTRONIC CIRCUIT ARRAY SUBSTRATE

(75) Inventor: Tetsuya Kawamura, Saitama-ken (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 0 days.

(21) Appl. No.: 10/997,934

(22) Filed: Nov. 29, 2004

(65) Prior Publication Data

US 2005/0127358 A1  Jun. 16, 2005

(30) Foreign Application Priority Data

Dec. 15, 2003 (JP) .............................. 2003-416676

(51) Int. Cl.
*H01L 29/04* (2006.01)
*G02F 1/1368* (2006.01)

(52) U.S. Cl. .............................. 257/59; 257/72; 257/57; 349/39; 349/43; 349/139; 349/42

(58) Field of Classification Search .................. 257/59, 257/72, 60, 71, 57; 359/887; 349/39, 41, 349/187
See application file for complete search history.

(56) References Cited

U.S. PATENT DOCUMENTS

| 5,784,131 | A | * | 7/1998 | Kim et al. ................... 349/39 |
| 6,515,720 | B1 |  | 2/2003 | Iizuka et al. |
| 2003/0202267 | A1 | * | 10/2003 | Yamasaki et al. ........... 359/883 |

* cited by examiner

*Primary Examiner*—Nathan J. Flynn
*Assistant Examiner*—Fazli Erdem
(74) *Attorney, Agent, or Firm*—Oblon, Spivak, McClelland, Maier & Neustadt, P.C.

(57) ABSTRACT

Dummy holes 36 are made for every one of display dot 5*a*, 5*b* and 5*c* at pixels 5 through interlayer film 33 up to gate electrode and scanning lines 11 before interlayer film 33 on glass substrate 3 is washed. When interlayer film 33 is washed, electric charges stored at semiconductor layer 21 are substantially the same in quantity as those stored at gate electrode and scanning lines 11 through dummy holes 36. Thus, electric potentials at gate electrode and scanning lines 11 are substantially equal in magnitude to those at semiconductor layer 21. This can suppress the occurrence of voltage differences imposed between gate electrode and scanning lines 11 and semiconductor layer 21.

10 Claims, 5 Drawing Sheets

SEMICONDUCTOR DEVICE, ELECTRONIC CIRCUIT ARRAY SUBSTRATE PROVIDED WITH THE SAME AND METHOD OF MANUFACTURING THE ELECTRONIC CIRCUIT ARRAY SUBSTRATE

CROSS-REFERENCE TO RELATED APPLICATION

This application is based upon and claims the benefit of priority from the prior Japanese Patent Application No. 2003-416676, filed on Dec. 15, 2003, the entire contents of which are incorporated in this application by reference.

FIELD OF THE INVENTION

This invention relates to a semiconductor device including a semiconductor layer arranged apart from an electrically conductive layer or line, an electronic circuit array substrate provided with the semiconductor device and a method of manufacturing the electronic circuit array substrate.

BACKGROUND OF THE INVENTION

Many liquid crystal display devices as flat panel display devices are provided with sandwich structures of electronic circuit array substrates, counter substrates and liquid crystal compositions as shown in Japanese Patent Publication 2000-187248 (particularly, see descriptions at pages 4–6 and FIGS. 1–3), for instance. The electronic circuit array substrates include insulation substrates such as glass plates on which pixels are configured in a matrix form. Each pixel contains a set of red, green and blue color-display dots, for instance, each of which includes a pixel electrode, an electric capacitor and thin-film transistors.

Further, island-like poly-crystalline silicon films, for instance, are formed on the electronic circuit array substrate. The silicon films are covered with a gate insulation film on which, in turn, scanning lines connected to gate electrodes disposed. Auxiliary electric capacitor lines are provided apart from the scanning lines but on the gate insulation film.

The scanning lines and the auxiliary electric capacitor lines are coated with an interlayer insulation film through which contact holes are made. Signal lines are formed on the interlayer film and are electrically connected to the poly-crystalline silicon layer through the contact holes in which electrically conductive materials are filled.

The array substrate is provided opposite to the counter substrate which includes an insulation substrate such as a glass substrate and color filters formed on the insulation substrate. A liquid crystal composition is held between the electronic circuit array and counter substrates and is sealed at circumferences of the substrates by a sealant.

The liquid crystal display device described above needs a large number of pixels to display a mass of data. A color liquid crystal display device of this type, in particular, used for a personal computer requires red, green and blue color-display dots per pixel so that its electronic circuit array substrate must be provided with several millions of pixels with them Display requirements for such a liquid crystal display device have been recently quite high in level. One such requirement is to have as little point-defect pixels as possible or no point-defect pixels. It is, however, extremely difficult to manufacture liquid crystal display devices with little or no point-defect pixels at a good yield rate. Thus, it is important to provide a liquid crystal display device with no point-defect pixel structures or methods of manufacturing the same.

One of the big causes of point-defect pixels is electro-static destruction in manufacturing an electronic circuit array substrate of a liquid crystal display device. Abnormal characteristics of the thin-film transistors, for instance, may be caused by electro-static destructions in the case that an electronic circuit array substrate is washed after the formation of poly-crystalline silicon films patterned for thin-film transistors, a gate insulation film, scanning lines, auxiliary capacitor lines, an interlayer insulation film and contact holes in the interlayer and gate insulation films on the electronic circuit array substrate, i.e., before the formation of signal lines on the interlayer insulation film.

SUMMARY OF THE INVENTION

Accordingly, the present invention provides a semiconductor device configured to suppress electrostatic destructions, an electronic circuit array substrate provided with the semiconductor device and a method of manufacturing the electronic circuit array substrate.

The first aspect of the present invention is directed to a semiconductor device provided with a semiconductor layer, an insulation film formed on the semiconductor layer, electric lines formed on the insulation film, and an interlayer film formed on the lines and containing a first aperture connected to the semiconductor layer and a second aperture connected to the electric lines.

The second aspect of the present invention is directed to a method of manufacturing a transistor array substrate including the steps of forming a semiconductor layer on an optically transparent substrate, forming an insulation film on the semiconductor layer, forming lines on the insulation film, forming an interlayer film on the lines, making a first aperture through the interlayer film and the insulation film up to the semiconductor layer, making a second aperture through the interlayer film up to the lines, and washing the interlayer film after the second aperture is made.

With this structure and/or method, when the front surface of interlayer film is washed with the fluids after the second aperture is made though it, electric discharges, which are substantially the same as the ones stored in the semiconductor layer, are carried into the lines though the second aperture. Thus, the electric potential at the lines is substantially equal to the one at the semiconductor layer. As a result, electrostatic destruction of the semiconductor is effectively suppressed so that the yield rate of an electronic circuit array substrate can be improved significantly.

BRIEF DESCRIPTION OF THE DRAWINGS

A more complete appreciation of the present invention and many of its attendant advantages will be readily obtained as the same becomes better understood by reference to the following detailed descriptions when considered in connection with the accompanying drawings, wherein.

DESCRIPTION OF THE EMBODIMENTS

Figure 1:
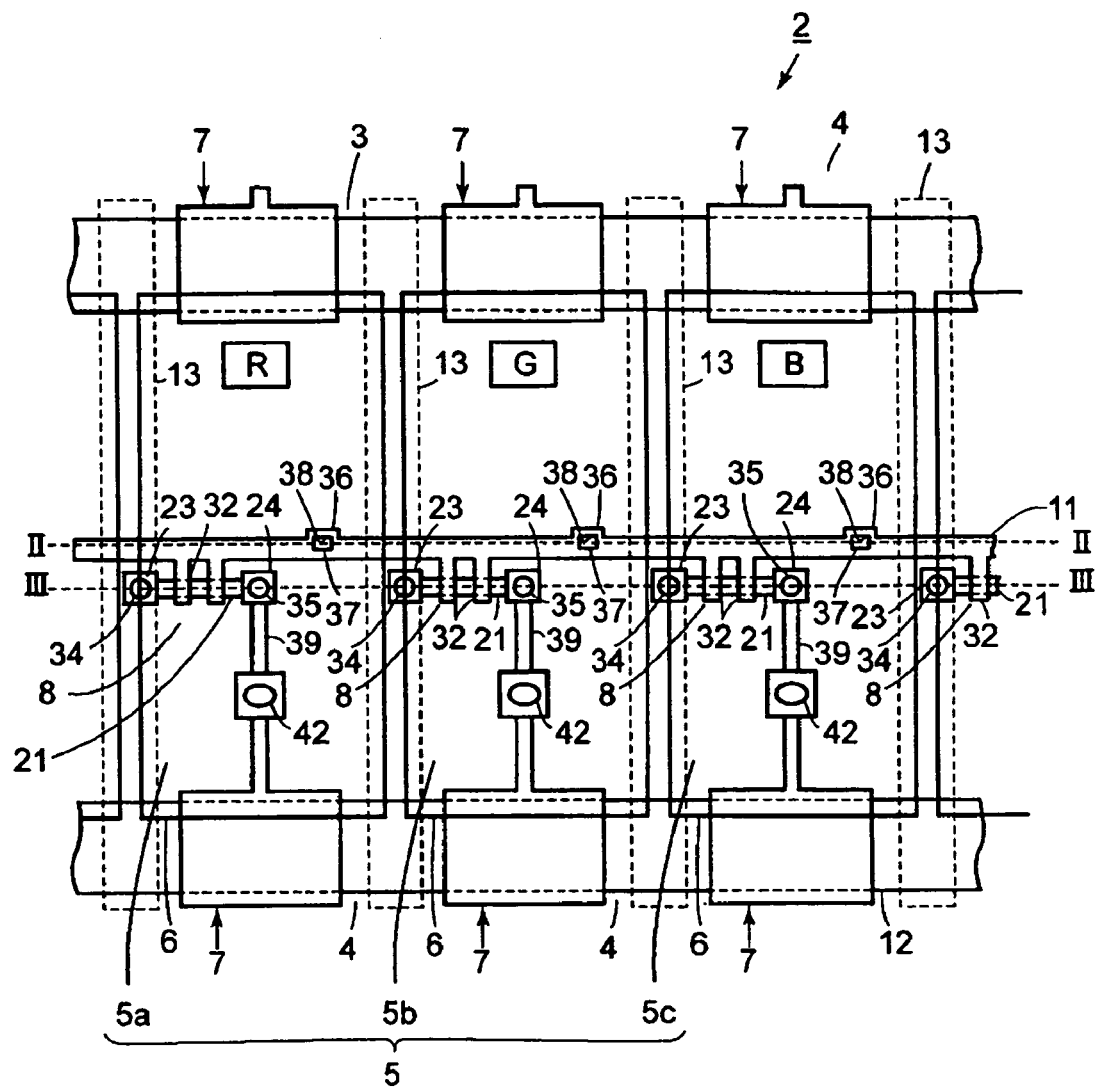
FIG. 1 is a schematic plan view of an electronic circuit array substrate in accordance with the first embodiment of the present invention.

Embodiments of the present invention will be described below with reference to the attached drawings. It should be noted that the present invention is not limited to the embodiments but covers their equivalents. Throughout the attached drawings, similar or same reference numerals show similar, equivalent or same components.

A liquid crystal display device of the first embodiment will be described below with reference to FIGS. 1–5.

Figure 5:
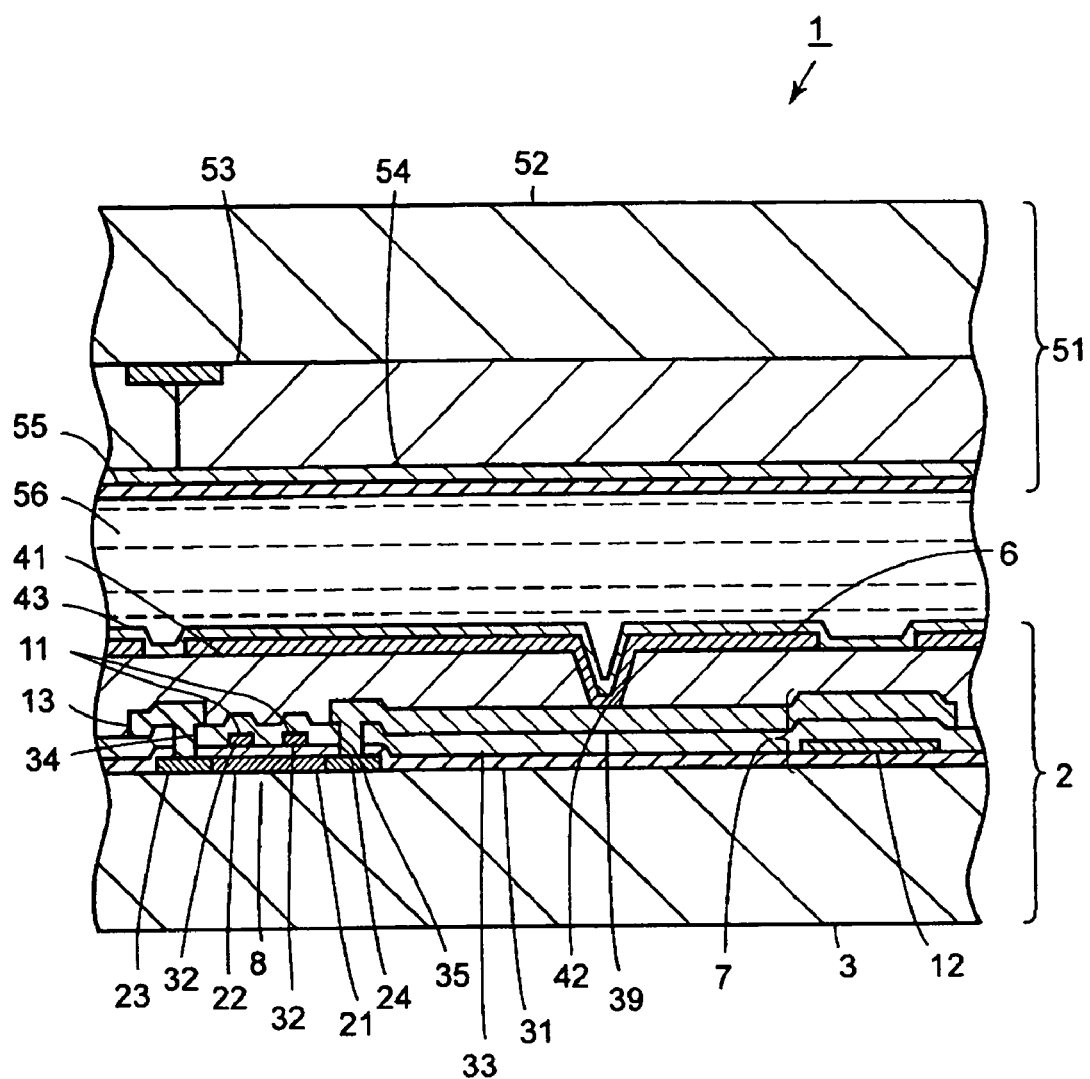
FIG. 5 is a schematic cross-sectional view of a liquid crystal display device with the electronic circuit array substrate shown in FIG. 1.

Liquid crystal display device 1 includes an electronic circuit array substrate such as thin-film transistor array substrate 2 in which top-gate-type thin-film transistors 8 are provided as shown in FIG. 5. Thin-film transistor array substrate 2 has a rectangular, optically transparent and electrically insulating substrate 3 such as # 1737 glass substrate manufactured by Corning Incorporated.

Figure 4:
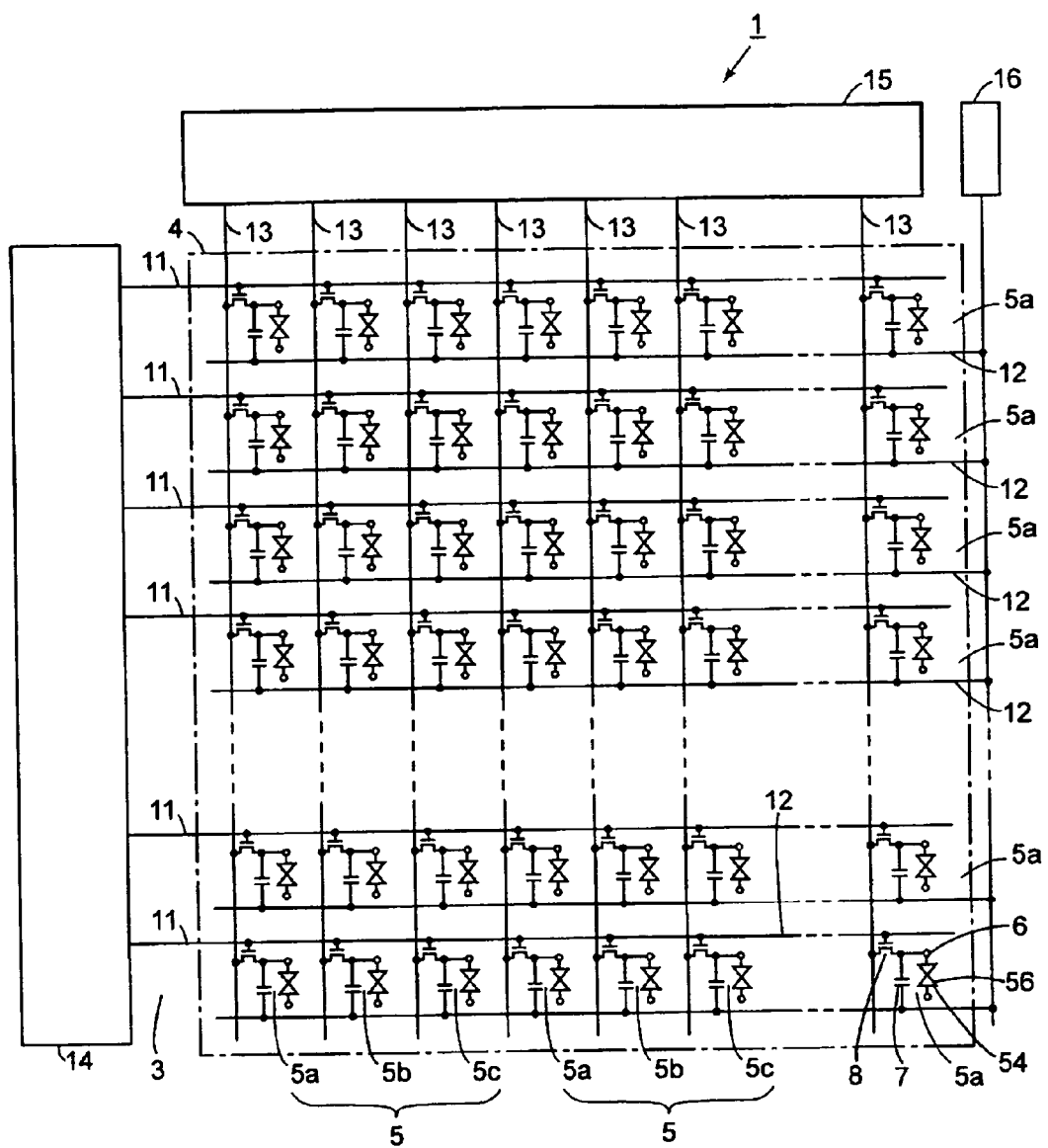
FIG. 4 is a circuit diagram of the electronic circuit array substrate shown in FIG. 1.

As shown in FIG. 4, glass substrate 3 contains display region 4 on its primary surface. Display region 4 is provided with a large number of pixels 5 in a matrix form. Each pixel 5 contains at least two-color display-dots and, particularly, red, green and blue color display-dots 5a–5c in the embodiment. These display-dots 5a–5c are regularly, repeatedly disposed in pixels 5. Display-dot 5a, 5b or 5c is basically composed of pixel electrode 6, accumulation capacitor 7 and thin-film transistor 8.

Gate electrode and scanning lines 11 made from molybdenum alloy are disposed on glass substrate 3 in the horizontal direction and are vertically spaced in parallel with each other. Gate electrode and scanning lines 11 are connected to thin-film transistors 8.

Auxiliary capacitor lines or common capacitor lines 12 are provided between gate electrode and scanning lines 11 in the horizontal direction of glass substrate 3, are equally spaced in the vertical direction and are disposed in parallel with gate electrode and scanning lines 11. Further, common capacitor lines 12 are electrically connected to accumulation or auxiliary pixel capacitors 7 and thin-film transistors 8.

Video signal lines or signal line layers 13 are formed on the surface of glass substrate 3 in the vertical direction, are equally spaced in the horizontal direction and are made of Al and high melting point metal films.

Y driver circuit or gate driver circuit 14 provided along a horizontal (left) edge side of glass substrate 3 contains shift registers electrically connected to gate electrode and scanning lines 11 of thin-film transistors 8.

X driver circuit or video signal circuit 15 provided along a vertical (upper) edge side of glass substrate 3 contains driver circuits electrically connected to video signal lines 13. Common capacitor lines 12 are together electrically connected to driver circuit 16.

With reference to FIGS. 4 and 5, thin-film transistors 8 are provided as switching elements of pixels 5. Thin-film transistors 8 include semiconductor layers 21 made from poly-crystalline silicon formed on undercoat films, not shown, made from silicon oxide and/or silicon nitride.

Poly-crystalline silicon semiconductor layers 21 are made by annealing amorphous silicon films to melt and re-crystallize with an excimer laser. Poly-crystalline silicon semiconductor layers 21 are semiconductor patterns of thin-film transistors which have active layers of channel regions 22 at their central portions, and source and drain regions 23 and 24 on both end portions of channel regions 22.

Channel regions 22, source and drain regions 23 and 24 and the undercoat film are covered with gate insulation film 31 made from silicon oxide. Gate insulation film 31 is a 150 nm thick silicon oxide film deposited by applying a plasma chemical deposition method. In other words, silicon oxide gate insulation film 31 is formed on poly-crystalline silicon semiconductor layers 21.

Pairs of narrow rectangle gate electrodes 32 are formed on gate insulation film 31 provided opposite to channel regions 22 of thin-film transistors 8. Gate electrodes 32 are in parallel with each other and are spaced along, and connected to, gate electrode and scanning lines 11 to form their parts as shown in FIG. 1. In short, gate electrodes 32 are formed to be individual narrow rectangle in shape projecting vertically from gate electrode and scanning lines 11.

Here, gate insulation film 31 is put between gate electrode and scanning lines 11 and poly-crystalline silicon semiconductor layer 21 which are laid to overlap each other. In other words, gate electrode and scanning lines 11 are separated from poly-crystalline silicon semiconductor layer 21 by gate insulation film 31.

Common capacitor lines 12 are formed on gate insulation film 31 as shown in FIG. 5 while drain electrodes 39 are provided with extending portions opposite to common capacitor lines 12 through interlayer film 33. Thus, accumulation or auxiliary pixel capacitors 7 are defined by interlayer film 33 and electrodes of common capacitor lines 12 and extending portions from drain electrodes 39 between which interlayer film 33 is inserted. Common capacitor lines 12 are electrically isolated from gate electrodes 32 of thin-film transistors 8. Common capacitor lines 12 are made from the same materials, and by the same process, as gate electrode and scanning lines 11.

As described above, interlayer film 33 is coated on common capacitor lines 12, gate electrodes 32, gate electrode and scanning lines 11 and gate insulation film 31. Interlayer film 33 is made from stacked films of 350 nm thick silicon nitride and 450 nm thick silicon oxide deposited by applying a plasma chemical vapor deposition method. Here, interlayer film 33 is provided on a primary surface of gate electrode and scanning lines 11 and on the opposite side with respect to poly-crystalline silicon semiconductor layer 21.

Figure 3:
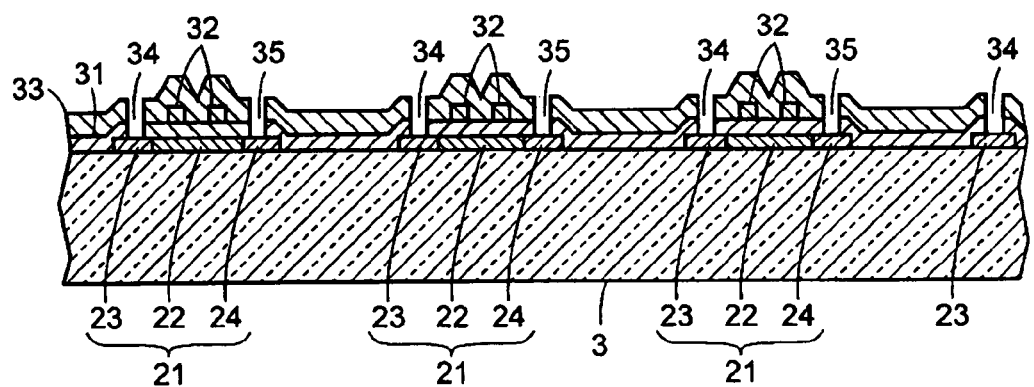
FIG. 3 is a cross-sectional view of the electronic circuit array substrate not completed but formed up to the formation of the interlayer film and cut along line III—III shown in FIG. 1.

As shown in FIGS. 1, 3 and 5, contact holes 34 and 35 are made through interlayer film 33 and gate insulation film 31 as first apertures of electrically conductive components. Contact holes 34 and 35 are provided on both sides of gate electrodes 32 of thin-film transistors 8 and connected to source and drain regions of thin-film transistors 8, respectively.

Figure 2:
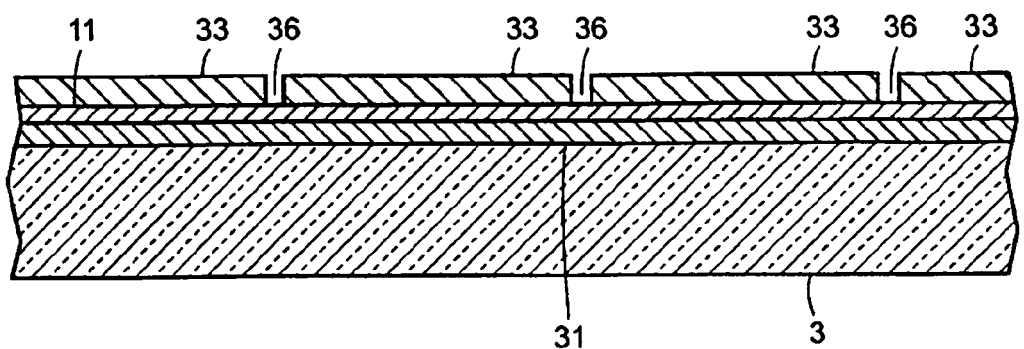
FIG. 2 is a cross-sectional view of the electronic circuit array substrate not completed but formed up to the formation of an interlayer film and cut along line II—II shown in FIG. 1.

Further, as shown in FIGS. 1 and 2, dummy holes 36 are made through interlayer film 33 up to gate electrode and scanning lines 11 as second apertures of electrically conductive components. Dummy holes 36 are provided for respective display dots of pixels 5 on glass substrate 3 of thin-film transistor array substrate 2. In other words, each dummy hole 36 is made for every display dot 5a, 5b or 5c. Dummy holes 36 form aperture patterns made through interlayer film 33.

Dummy holes 36 are made through interlayer film 33 to expose parts of gate electrode and scanning lines 11 through which electric charges stored at poly-crystalline silicon semiconductor layers 21 of thin-film transistors 8 are discharged. Thus, it suppresses voltages imposed on gate insulation film 31 which is put between poly-crystalline silicon semiconductor layers 21 and gate electrode and scanning lines 11 so that electro-static destruction of thin-film transistors 8 can be reduced.

Contact holes 34 and 35 and dummy holes 36 are filled with patterns of coating films such as electrically conductive layers 37 which are made from the same materials as video signal lines 13 after a surface washing process for interlayer film 33 with etching or electrolysis liquids. Conductive layers 37 is provided on interlayer film 33 and filled in dummy holes 36 to cover the exposed parts of gate electrode and scanning lines 11 in dummy holes 36. Conductive layers 37 are made from the same materials and by the same process as video signal lines 13.

Gate electrode and scanning lines 11 are provided with rectangular wider width members 38 expanding in a vertical direction in the vicinity of dummy holes 36, which are made through the central portions of wider width members 38. Dummy holes 36 are provided for respective display dots 5a, 5b and 5c of pixels 5 and between adjacent pairs of gate electrodes 32 integrated with gate electrode and scanning lines 11.

Further, wider width member 38 of display dot 5a is disposed approximately in the middle between drain region 24 of thin-film transistor 8 in display dot 5a and source region 23 of thin-film transistor 8 in display dot 5b along gate electrode and scanning line 11. Wider width members 38 of display dots 5b and 5c are also arranged in similar manners to the above described one. In addition, wider width members 38 are provided to project vertically from gate electrode and scanning line 11 in the reverse direction to the one to which pairs of gate electrodes 32 project from gate electrode and scanning line 11.

Video signal lines 13 are formed on interlayer film 33 and also put in contact holes 34 so that video signal lines 13 are electrically connected to source regions 23 of thin-film transistors 8 as source electrodes.

Drain electrodes 39 are formed on interlayer film 33 and also put in contact holes 35 electrically connecting to drain regions 24 of thin-film transistors 8. Drain electrodes 39 and common capacitor lines 12 facing drain electrodes 39 hold interlayer film 33 to form capacitors 7. Further, drain electrodes 39 are electrically connected to drain regions 24 of thin-film transistors 8 through contact holes 35. Drain electrodes 39 are made from the same materials and by the same process as video signal lines 13.

Thin-film transistors 8 are composed of video signal lines 13, source regions 23 connected to video signal lines 13 through contact holes 34, drain regions 24, drain electrodes 39 connected to drain region 24 through contact holes 35, poly-crystalline silicon semiconductor layers 21, gate electrode and scanning lines 11, gate insulation film 31 and interlayer film 33. Thin-film transistors 8 are formed in matrix patterns on display region 4 of glass substrate 3.

Video signal lines 13, drain electrodes 39 and interlayer film 33 are coated with a protective layer of evening film 41. Evening film 41 is perforated to define contact holes 42, which are connected to drain electrodes 39 of thin-film transistors 8.

Evening film 41 and contact holes 42 are covered with pixel electrodes 6 made of indium-tin-oxide (ITO) thin films. Pixel electrodes 6 are electrically connected to drain electrodes 39 through contact holes 42. Further, pixel electrodes 6 are controlled by thin-film transistors 8. Evening film 41 and pixel electrodes 6 are coated with alignment film 43.

The front surface of thin-film transistor array substrate 2 is provided opposite to rectangular, flat, counter substrate 51, which includes glass substrate 52. More than two color filters, e.g., three dots of red, green and blue color filters are provided on the back surface of glass substrate 52. Color filters 53 are arranged to face corresponding display dots 5a, 5b and 5c of thin-film transistor array substrate 2.

Rectangular, flat, counter electrode 54 is formed on the back surface of color filters 53. When thin-film transistor array substrate 2 is assembled with counter substrate 51, counter substrate 51 is large enough in size to cover entire display region4. Further, counter electrode 54 is coated with alignment film 55.

Alignment film 43 of thin-film transistor array substrate 2 is arranged to face alignment film 55 of counter substrate 51 in the case that thin-film transistor array substrate 2 is assembled with counter substrate 51. In short, pixel electrodes 6 of thin-film transistor array substrate 2 are provided opposite to counter electrode 54 of counter substrate 51. Alignment film 43 of thin-film transistor array substrate 2 and alignment film 55 of counter substrate 51 are arranged to hold an optical modulation layer of liquid crystal composition 56.

Next, a method for manufacturing the first embodiment of thin-film transistor array substrate 2 will be described below.

An amorphous silicon film is deposited on the undercoat film by applying a plasma chemical vapor deposition method after glass substrate 3 is coated with the undercoat film.

Subsequently, excimer laser beams are irradiated onto the amorphous silicon film so that the amorphous silicon film can be melted and re-crystallized into a poly-crystalline silicon film.

The poly-crystalline silicon film is then doped and then subjected to a photolithography process to make patterns of island-like poly-crystalline silicon semiconductor layers 21 as shown in FIGS. 1 and 3.

Next, a plasma chemical vapor deposition method is applied to deposit 150 nm thick silicon oxide gate insulation film 31 on poly-crystalline silicon semiconductor layers 21 and the undercoat.

Subsequently, a molybdenum alloy conductive layer is formed on gate insulation film 31 and the conductive layer is etched to make gate electrodes 32, gate electrode and scanning lines 11 and common capacitor lines 12.

Source and drain regions 23 and 24 in poly-crystalline silicon semiconductor films 21 of thin-film transistors 8 are doped with a P- or N-type impurity by using gate electrodes 32 as photomasks.

A plasma chemical vapor deposition is again applied to deposit 350 nm silicon nitride and 450 nm thick silicon oxide films to form interlayer film 33 on gate insulation film 31, gate electrode and scanning lines 11 and common capacitor lines 12.

A photolithography process is carried out to make contact holes 34 and 35 through interlayer film 33 and gate insulation film 31 for source and drain regions 23 and 24 of thin-film transistors 8, respectively, as shown in FIG. 3.

Another photolithography process is carried out to make dummy holes 36 through interlayer film 33 to be connected to wider width members 33 of gate electrode and scanning lines 11 at display dots 5a, 5b and 5c, as shown in FIGS. 1 and 2.

A washing process is carried out to clean the front surface of interlayer film 33 with fluids, such as etching liquid and electrolyzed water of pure one bubbled with CO2. Instead, an etching process may be applied to the front surface of interlayer film 33 as such a washing process.

Interlayer film 33 is stacked with, and dummy holes 36 and contact holes 34 and 35 are filled with, a conductive layer made of Al and high melting point metal films (the stacked structure of which is not shown). The conductive layer is then etched in the same photolithography process for coating films 37 for dummy holes 36, video signal lines 13 functioning as source electrodes of thin-film transistors 8 and drain electrodes 39 to be made from the same materials.

Further, evening film 41 is entirely formed on video signal lines 13, drain electrodes 39 and interlayer film 33.

Subsequently, an etching is carried out for evening film. 41 in a photolithography process to make contact holes to be connected to drain electrodes 39 through evening film 41.

A transparent conductive film is then sputtered on evening film 41 and in contact holes 42 to form pixel electrodes 6, which are, in turn, subjected to photolithography and etching processes to make pixel patterns.

Next, pixel electrodes 6 and evening film 41 are coated with alignment film 43. Gate driver circuit 14, video signal circuit 15 and driver circuit 16 are provided at the circumference of display region 4 on glass substrate 3 of thin-film transistor array substrate 2.

Alignment film 43 of electronic circuit array 2 is arranged to face alignment film 55 of counter substrate 51 and electronic circuit array 2 is assembled with counter substrate 51. Liquid crystal composition 56 is put into a gap defined between electronic circuit array 2 and counter substrate 51 and tightly sealed with a sealant.

Finally, the basic structure described above and other components of system circuits, polarizers, a back light source, etc., are incorporated into a liquid crystal display device 1.

As described above in the first embodiment, contact holes 34 and 35 are made through interlayer film 33 formed on glass substrate 3. The front surface of interlayer film 33 is washed with etching liquid or electrolyzed water before video signal lines 13 are coated on the front surface of interlayer film 33. In this case, however, even though such fluids are used after the removal of electric charges from them, electric charges are still stored in poly-crystalline silicon semiconductor layers 21 through contact holes 34 and 35 because the fluids may carry electric charges for some reason or other and friction between the fluids and the surface of interlayer film 33 causes electric charges.

The electric charges stored in poly-crystalline silicon semiconductor layers 21 give rise to electric potential differences between poly-crystalline silicon semiconductor layers 21 and gate electrodes 32 so that they may cause electrostatic destruction at gate insulation film 31 disposed between poly-crystalline silicon semiconductor layers 21 and gate electrodes 32.

In order to avoid such electrostatic destruction, dummy holes 36 are made at display dots 5a, 5b and 5c of pixels 5 through interlayer film 33 up to wider width members 38 of gate electrode and scanning lines 11 before the front surface of interlayer film 33 is washed with the fluids.

With this structure, when the front surface of interlayer film 33 is washed with the fluids after dummy holes 36 are made though it, electric discharges, which are substantially the same as the ones stored in poly-crystalline silicon semiconductor layers 21, are carried into gate electrode and scanning lines 11 though dummy holes 36. Thus, the electric potential at gate electrode and scanning lines 11 is substantially equal to the one at poly-crystalline silicon semiconductor layers 21.

As a result, it suppresses the occurrence of potential differences between poly-crystalline silicon semiconductor layers 21 and gate electrode and scanning lines 11, i.e., that of voltages at gate insulation films 31 imposed between poly-crystalline silicon semiconductor layers 21 and gate electrodes 32. In other words, the electrostatic destruction of gate insulation films 31 is effectively suppressed so that thin-film transistors 8 may be prevented from abnormal characteristics due to such electrostatic destruction.

Accordingly, thin-film transistors 8 formed at display dots 5a, 5b and 5c of pixels 5 are highly protected. Point defects at display dots 5a, 5b and 5c of pixels 5 caused by the electrostatic charges are significantly reduced in the washing process between the formation of interlayer film 33 and the coating of video signal lines 13 with such simple provisions of dummy holes 36 as made through interlayer film 33 up to gate electrode and scanning lines 11. In short, thin-film transistors 8 are protected from damage without substantially additional processes.

Thus, the yield rate of liquid crystal display device 1 provided with thin-film transistor array substrate 2 increases remarkably. The structure of dummy holes 36 of the present invention is particularly suitable for liquid crystal display device 1 provided with thin-film transistors 8 containing poly-crystalline silicon semiconductor films 21 for display dots 5a, 5b and 5c of pixels 5 and large display size liquid crystal display device 1 provided with long gate electrode and scanning lines 11.

Since dummy holes 36 are filled with coating film 37 made from the same materials as for video signal lines 13 and coating film 37, and video signal lines 13 and interlayer film 33 are coated with evening film 41, the provision of dummy holes 36 does not result in incorrect operations or damages of thin-film transistors 8.

Figure 6:
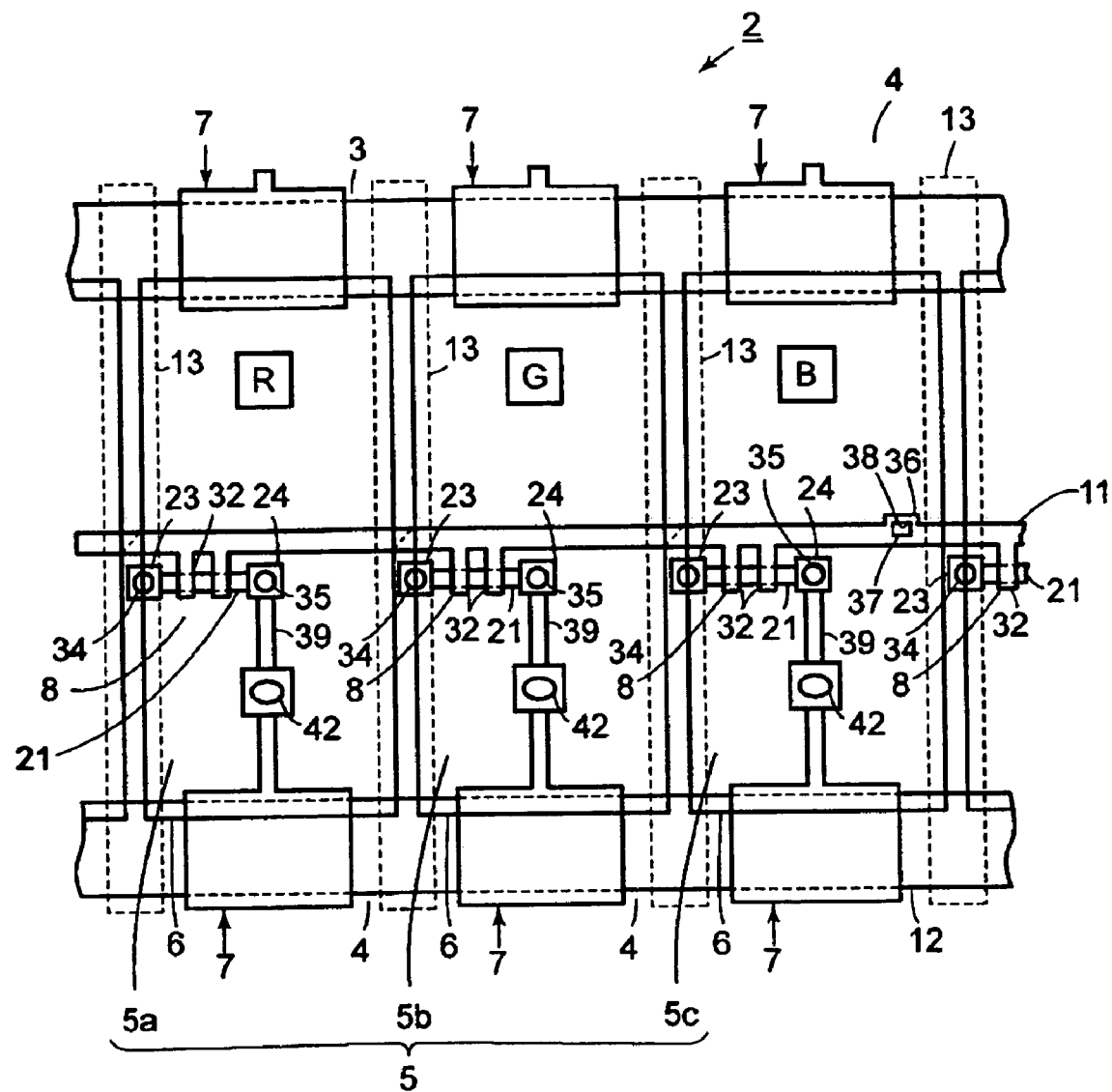
FIG. 6 is a cross-sectional view of an electronic circuit array substrate in accordance with the second embodiment of the present invention.

Although dummy hole 36 is provided for every display dot 5a, 5b or 5c of pixel 5 in the first embodiment, dummy hole 36 may be provided for every particular color display dots, such as blue color display dot 5c of pixel 5, at wider width member 38 as shown in FIG. 6. In other words, every pixel 5 is provided with one dummy hole 36 and wider width member 38 for a specific one of color display dots 5a, 5b and 5c.

As another embodiment of those shown in FIGS. 1 and 6, a plurality of dummy holes 36 may be provided for every one of display dots 5a, 5b and 5c.

Thus, one or more dummy holes 36 may be provided for every one of display dots 5a, 5b and 5c or two or more dummy holes 36 may be provided for every pixel 5.

Although liquid crystal composition 56 is held between electronic circuit array 2 and counter substrate 51 as an optical modulator in the embodiments described above, an organic electro-luminescent element or other light-emitting elements may be substituted for liquid crystal composition 56

Further, gate driver circuit 14, video signal circuit 15 and driver circuit 16 are integrated with thin-film transistor array substrate 2 at circumferences of display region 4 on glass substrate 3 but they may be provided separately from, and connected to, thin-film transistor array substrate 2.

The present invention is not limited to the embodiments described above. Although the invention has been described in its applied form with a certain degree of particularity, it is understood that the present disclosure of the preferred form can be changed in the details of construction and the combination and arrangement of components may be resorted to without departing from the spirit and the scope of the invention as hereinafter claimed. Some components of the embodiments may be eliminated or various components from different embodiments may also be combined.

What is claimed is:

1. An electronic circuit array substrate, comprising:
   a display region provided with display dots;
   a semiconductor device including
      a semiconductor layer provided in said display region,
      an insulation film provided on said semiconductor layer,
      electrically conductive lines formed on said insulation film, and
      an interlayer film formed on said lines and provided with a first aperture connected to said semiconductor layer and a second aperture connected to said electrically conductive lines; and
   an optically transparent substrate on which said semiconductor device is formed, wherein
   said semiconductor layer, said insulation film and said electrically conductive lines form thin-film transistors, and
   said thin-film transistors are provided for said display dots and said second aperture is provided for said display dots of said display region.

2. An electronic circuit array substrate according to claim 1, wherein said second aperture is provided for each of said display dots of said display region.

3. An electronic circuit array substrate according to claim 1, wherein said display dots have at least two-color dots to form pixels disposed in said display region, and said second aperture is provided for each of said pixels.

4. An electronic circuit array substrate according to claim 1, further including a coating film filled in said second aperture defined in said interlayer film.

5. An electronic circuit array substrate according to claim 4, further including a signal line connected to said semiconductor layer of said thin-film transistor, said coating film being formed in the same process as said signal lines.

6. An electronic circuit array substrate according to claim 2, further including a coating film filled in said second aperture defined in said interlayer film.

7. An electronic circuit array substrate according to claim 6, further including a signal line connected to said semiconductor layer of said thin-film transistor, said coating film being formed in the same process as said signal lines.

8. An electronic circuit array substrate according to claim 3, further including a coating film filled in said second aperture defined in said interlayer film.

9. An electronic circuit array substrate according to claim 8, further including a signal line connected to said semiconductor layer of said thin-film transistor, said coating film being formed in the same process as said signal lines.

10. A method of manufacturing an electronic circuit array substrate, comprising:
    forming a semiconductor layer in a display region on an optically transparent substrate;
    forming an insulation film on said semiconductor layer;
    forming electrically conductive lines on said insulation film;
    forming an interlayer film on said electrically conductive lines, wherein said semiconductor layer, said conductive lines and said insulation film form thin-film transistors provided for display dots in said display region;
    making a first aperture through said interlayer film and said insulation film up to said semiconductor layer;
    making a second aperture through said interlayer film up to said conductive lines, said second aperture is provided for said display dots; and
    washing said interlayer film after said second aperture is made.

* * * * *